United States Patent
Murao (10) Patent No.: US 9,438,173 B2
(45) Date of Patent: Sep. 6, 2016

(54) MULTIPLE-SERIES AMPLIFYING DEVICE (75) Inventor: Yoji Murao, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/403,291

(22) PCT Filed: May 29, 2012

(86) PCT No.: PCT/JP2012/063738
§ 371 (c)(1),
(2), (4) Date: Nov. 24, 2014

(87) PCT Pub. No.: WO2013/179382
PCT Pub. Date: Dec. 5, 2013

(65) Prior Publication Data
US 2015/0303879 A1 Oct. 22, 2015

(51) Int. Cl.
H03F 1/02 (2006.01)
H03F 3/21 (2006.01)
H03F 3/68 (2006.01)
H03F 3/24 (2006.01)
H03F 3/189 (2006.01)
H03F 3/60 (2006.01)

(52) U.S. Cl.
CPC ............ *H03F 1/0288* (2013.01); *H03F 3/189* (2013.01); *H03F 3/211* (2013.01); *H03F 3/245* (2013.01); *H03F 3/602* (2013.01); *H03F 3/68* (2013.01); *H03F 2203/21106* (2013.01); *H03F 2203/21157* (2013.01)

(58) Field of Classification Search
USPC ............. 330/295, 124 R, 84, 286, 53–54
See application file for complete search history.

(56) References Cited

U.S. PATENT DOCUMENTS

| 8,558,620 B2 * | 10/2013 | Fraysse | H03F 3/602 330/286 |
| 8,710,924 B2 * | 4/2014 | van der Zanden | H03F 1/0288 330/124 R |
| 2010/0184393 A1 | 7/2010 | Tougou | |
| 2011/0006858 A1 | 1/2011 | Fraysse | |

FOREIGN PATENT DOCUMENTS

| CN | 101091322 A | 12/2007 |
| EP | 2 166 672 A1 | 3/2010 |

(Continued)

OTHER PUBLICATIONS

International Search Report corresponding to PCT/JP2012/063738, dated Aug. 28, 2012 (4 pages).

(Continued)

*Primary Examiner* — Hieu Nguyen
(74) *Attorney, Agent, or Firm* — Wilmer Cutler Pickering Hale and Dorr LLP (57) ABSTRACT

A multiple-series amplifying device (100) of the present invention includes multiple series of amplifiers (110, 120) which are formed in parallel so as to input and output signals individually. Each of multiple-series of amplifiers (110, 120) includes a plurality of semiconductor amplifying elements (111, 112, 121, 122) which are driven in parallel so as to amplify signals. A pair of semiconductor amplifying elements (112, 121) adjoining together in a pair of amplifiers (110, 120) is formed in a single package (130).

9 Claims, 5 Drawing Sheets

(56) References Cited

FOREIGN PATENT DOCUMENTS

| | | |
|---|---|---|
| JP | 06-283877 A | 10/1994 |
| JP | 09-064758 A | 3/1997 |
| JP | 2002-314347 A | 10/2002 |
| JP | 2005-050974 A | 2/2005 |
| JP | 2005-210224 A | 8/2005 |
| JP | 2008-035487 A | 2/2008 |
| WO | WO-2009/004733 A1 | 1/2009 |

OTHER PUBLICATIONS

Supplementary European Search Report issued by the European Patent Office for Application No. 12878066.5, dated Dec. 14, 2015 (7 pages).

Chinese Office Action issued by the State Intellectual Property Office of the People's Republic of China for Application No. 201280073412.7 dated May 20, 2016 (16 pages).

* cited by examiner

MULTIPLE-SERIES AMPLIFYING DEVICE

CROSS-REFERENCE TO RELATED APPLICATIONS

This application is a national stage application of International Application No, PCT/JP2012/063738 entitled "Multiple-Series Amplifying Device," filed on May 29, 2012, the disclosure of which is hereby incorporated by reference in its entirety.

TECHNICAL FIELD

The present invention relates to a multiple-series amplifying device including multiple series of amplifiers each having a plurality of semiconductor amplifying elements which are driven in parallel so as to amplify signals.

BACKGROUND ART

Currently, multiple-series transmitting devices each having a plurality of transmitting systems such as transmission diversity devices and MIMO (Multiple-Input and Multiple-Output) devices have been designed using multiple-series amplifying devices.

Multiple-series amplifying devices include multiple series of amplifiers which are formed in parallel so as to input and output signals individually. Each of multiple series of amplifiers includes a plurality of semiconductor amplifying elements which are driven in parallel so as to amplify signals.

Multiple-series amplifying devices demonstrate high-output performance since a plurality of semiconductor amplifying elements are driven in parallel, while multiple-series amplifying devices of a Doherty-type demonstrate high efficiencies since a plurality of semiconductor amplifying elements are driven in parallel.

It is possible to design an amplifier in which a first amplifying element and a second amplifying element, serving as the last stage of amplification power elements, are disposed between an input terminal and an output terminal, wherein the first amplifying element and the second amplifying element are formed on a single semiconductor chip (see Patent Literature Document 1).

Additionally, it is possible to design another amplifier in which an output signal of a digital modulator is input to a power amplifying device and distributed into n signals via an n-distributor; n signals are subjected to n input phase shifters having different phase shifts and then amplified with a power amplifier; n signals are subjected to n output phase shifters so that their phases will match each other; subsequently, n signals are combined together with an n-combiner so as to output a combined signal via an output terminal (see Patent Literature Document 2).

CITATION LIST

Patent Literature Document

Patent Literature Document 1: Japanese Patent Application Publication No, 2008-035487
Patent Literature Document 2: Japanese Patent Application Publication No. 1-109-064758

SUMMARY OF INVENTION

Technical Problem

Since the foregoing multiple-series amplifying device needs a plurality of semiconductor amplifying elements for each of multiple series of amplifiers, it is necessary to use "A×B" semiconductor amplifying elements in total in which A represents the number of series of amplifiers while B represents the number of semiconductor amplifying elements for each amplifier.

For this reason, it is difficult to miniaturize the foregoing multiple-series amplifying devices with large circuit scales due to the large number of semiconductor amplifying elements, resulting in low productivity.

Each of the amplifiers disclosed in Patent Literature Documents 1 and 2 has a pair of an input terminal and an output terminal. Those amplifiers cannot amplify multiple series of signals in parallel; hence, they cannot serve as multiple-series amplifying devices used for multiple-series transmitters.

The present invention is created in consideration of the aforementioned problem so as to provide a multiple-series amplifying device which can solve the aforementioned problem.

Solution to Problem

The present invention provides a multiple-series amplifying device including multiple series of amplifiers which are formed in parallel so as to input and output signals individually, wherein each of the multiple series of amplifiers has a plurality of semiconductor amplifying elements which are driven in parallel so as to amplify signals, and wherein at least a pair of semiconductor amplifying elements adjoining together in a pair of amplifiers is formed in a single package.

Advantageous Effects of Invention

The present invention can reduce the number of parts for use in semiconductor amplifying elements in a multiple-series amplifying device since at least a pair of semiconductor amplifying elements adjoining together in a pair of amplifiers is formed in a single package.

DESCRIPTION OF EMBODIMENTS

Figure 1:
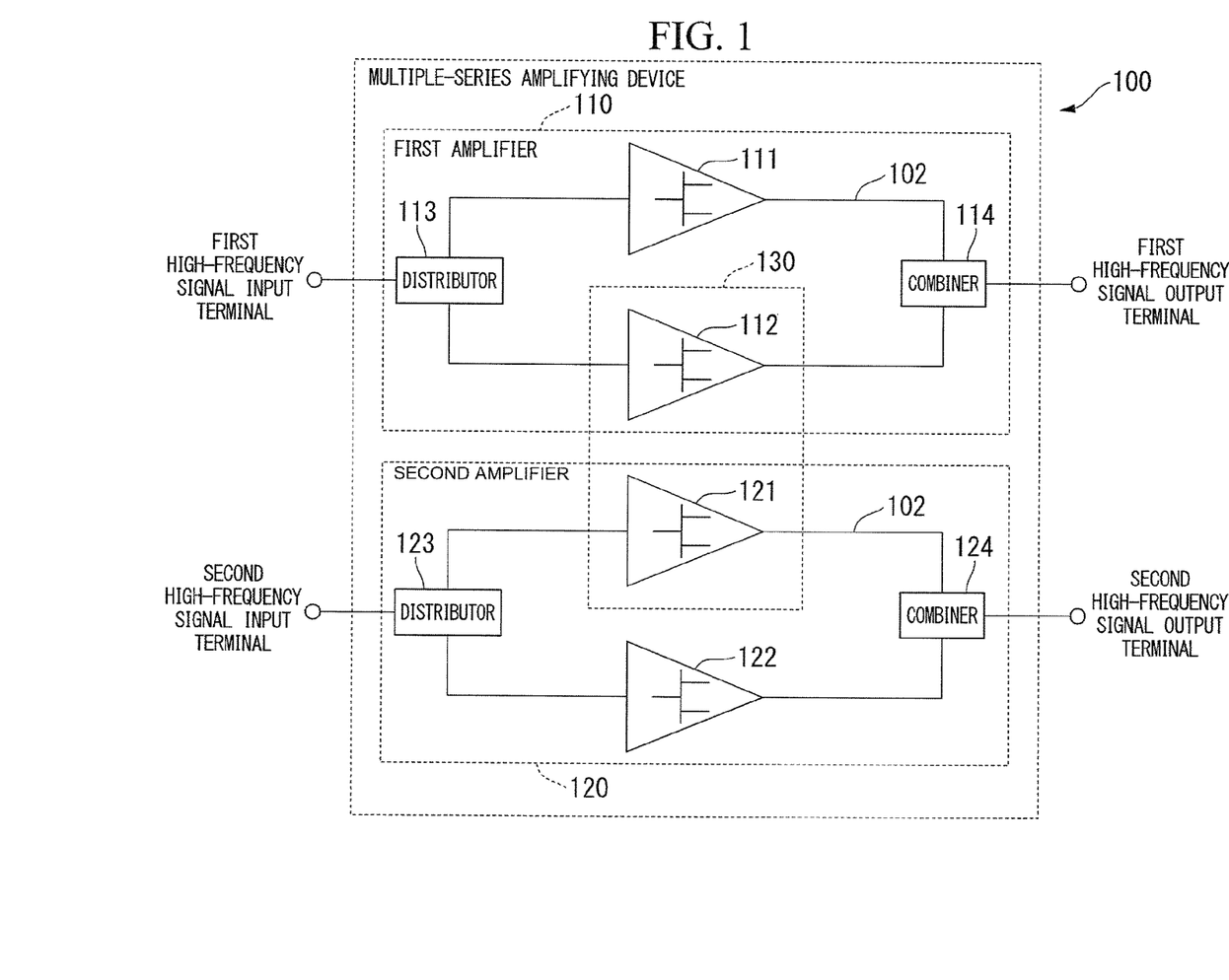
FIG. 1 is a circuit diagram showing the configuration of a multiple-series amplifying device according to a first embodiment of the present invention.

First, a multiple-series amplifying device 100 according to the first embodiment of the present invention will be described with reference to FIGS. 1 and 2. FIG. 1 is a circuit diagram diagrammatically showing the overall configuration of the multiple-series amplifying device 100, while FIG. 2 includes two illustrations diagrammatically showing the physical structure of a single package including a pair of semiconductor amplifying elements.

As shown in FIG. 1, the multiple-series amplifying device 100 of the present embodiment includes multiple series of amplifiers, i.e. a first amplifier 110 and a second amplifier 120, which are formed in parallel so as to input and output high-frequency signals individually.

The first amplifier 110 includes a first semiconductor amplifying element 111 and a second semiconductor amplifying element 112 with transistors which are driven in parallel so as to amplify high-frequency signals.

Similarly, the second amplifier 120 includes a first semiconductor amplifying element 121 and a second semiconductor amplifying element 122 which are driven in parallel so as to amplify high-frequency signals.

Specifically, the first amplifier 110 includes a first distributor 113 which is configured to distribute high-frequency signals input thereto, a pair of the first semiconductor amplifying element 111 and the second semiconductor amplifying element 112 which are driven in parallel so as to amplify high-frequency signals distributed thereto, and a first combiner 114 which is configured to combine and output the amplified high-frequency signals.

The second amplifier 120 includes a second distributor 123 which is configured to distribute high-frequency signals input thereto, a pair of the first semiconductor amplifying element 121 and the second semiconductor amplifying element 122 which are driven in parallel so as to amplify high-frequency signals distributed thereto, and a second combiner 124 which is configured to combine and output the amplified high-frequency signals.

Figure 2:
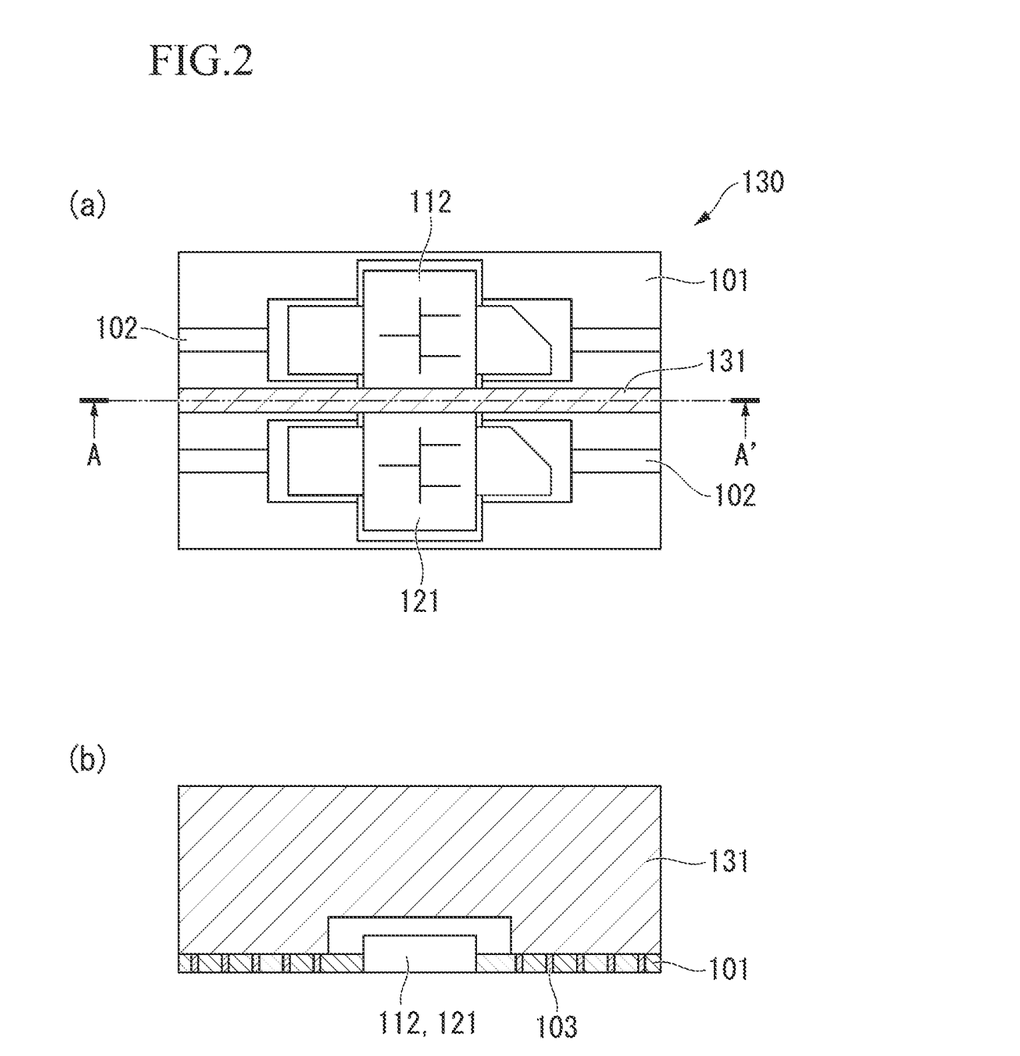
FIG. 2 includes two illustrations diagrammatically showing the essential structure of the multiple-series amplifying device according to the first embodiment of the present invention.

As shown in FIGS. 1 and 2, a pair of the second semiconductor amplifying element 112 and the first semiconductor amplifying element 121 adjoining together in the first amplifier 110 and the second amplifier 120 is formed in a single package 130.

FIG. 2(b) is a cross-sectional view taken along line A-A' in FIG. 2(a). As described above, the second semiconductor amplifying element 112 and the first semiconductor amplifying element 121, which are formed in a single package 130, are partitioned via a metal wall 131 serving as an electric isolation.

In the multiple-series amplifying device 100 serving as a multiple-series amplifying device of the present embodiment, as shown in FIG. 2(b), the parts of the amplifiers 110 and 120 are formed on the surface of a printed circuit board 101.

Signal transmitting lines 102 used to transmit high-frequency signals to the amplifiers 110 and 120 are formed as microstrip lines on the surface of the printed circuit board 101.

A ground pattern (not shown) applied to the signal transmitting lines 102 is formed on the back of the printed circuit board 101, while a metal pattern (not shown) connected to the metal wall 131 is formed on the surface of the printed circuit board 101.

The metal pattern and the ground pattern are connected together via via-holes 103 formed in the printed circuit board 101. For example, a power circuit (not shown) may supply power to the semiconductor amplifying elements 111 to 122 in parallel.

In the multiple-series amplifying device 100 of the present embodiment having the aforementioned configuration, a first high-frequency signal and a second high-frequency signal are amplified via the first amplifier 110 and the second amplifier 120 in parallel.

Specifically, a first high-frequency signal input to the first amplifier 110 is distributed to two paths via the first distributor 113. The distributed high-frequency signals are amplified with the first semiconductor amplifying element 111 and the second semiconductor amplifying element 112, which are driven in parallel. The amplified high-frequency signals are combined and output via the first combiner 114.

Similarly, a second high-frequency signal input to the second amplifier 120 is divided into two paths via the second distributor 123. The distributed high-frequency signals are amplified via the first semiconductor amplifying element 121 and the second semiconductor amplifying element 122, which are driven in parallel. The amplified high-frequency signals are combined and output via the second combiner 124.

Thus, the multiple-series amplifying device 100 of the present embodiment is designed to amplify two series of high-frequency signals in parallel, and therefore the present embodiment can be applied to multiple-series transmitting devices (not shown), each having a plurality of transmission systems, such as transmission diversity devices and MIMO devices.

In the multiple-series amplifying device 100 of the present embodiment, a pair of the second semiconductor amplifying element 112 and the first semiconductor amplifying element 121 adjoining together in the first amplifier 110 and the second amplifier 120 is formed in a single package 130.

Thus, it is possible to reduce the number of parts for use in the semiconductor amplifying elements 111 to 122 in the multiple-series amplifying device 100 of the present embodiment, and therefore it is possible to reduce the overall circuit scale, thus improving productivity.

Additionally, the second semiconductor amplifying element 112 and the first semiconductor amplifying element 121 which are formed in a single package 130 are partitioned using an electric isolation.

Thus, it is possible to prevent the second semiconductor amplifying element 112 and the first semiconductor amplifying element 121, which are formed in a single package 130, from electrically interfering with each other.

In particular, the metal wall 131 serves as an electric isolation used to partition the second semiconductor amplifying element 112 and the first semiconductor amplifying element 121. Thus, it is possible to form all the semiconductor amplifying elements 111 to 122 with a simple structure.

Moreover, the ground pattern for the signal transmitting lines 102 configured of microstrip lines used to transmit high-frequency signals to the first amplifier 110 and the second amplifier 120 is formed on the back of the printed circuit board 101 and connected to the metal wall 131, formed on the surface of the printed circuit board 101, via the metal pattern.

Thus, it is possible to ground the metal wall 131, serving as an isolation used to electrically partition the second semiconductor amplifying element 112 and the first semiconductor amplifying element 121, with a simple structure.

In particular, the metal pattern formed on the surface of the printed circuit board 101 is connected to the ground pattern formed on the back of the printed circuit board 101 via via-holes formed in the printed circuit board 101. Thus, it is possible to reliably connect the metal pattern and the ground pattern, which are formed on the surface and the back of the printed circuit board 101, with a simple structure.

Figure 3:
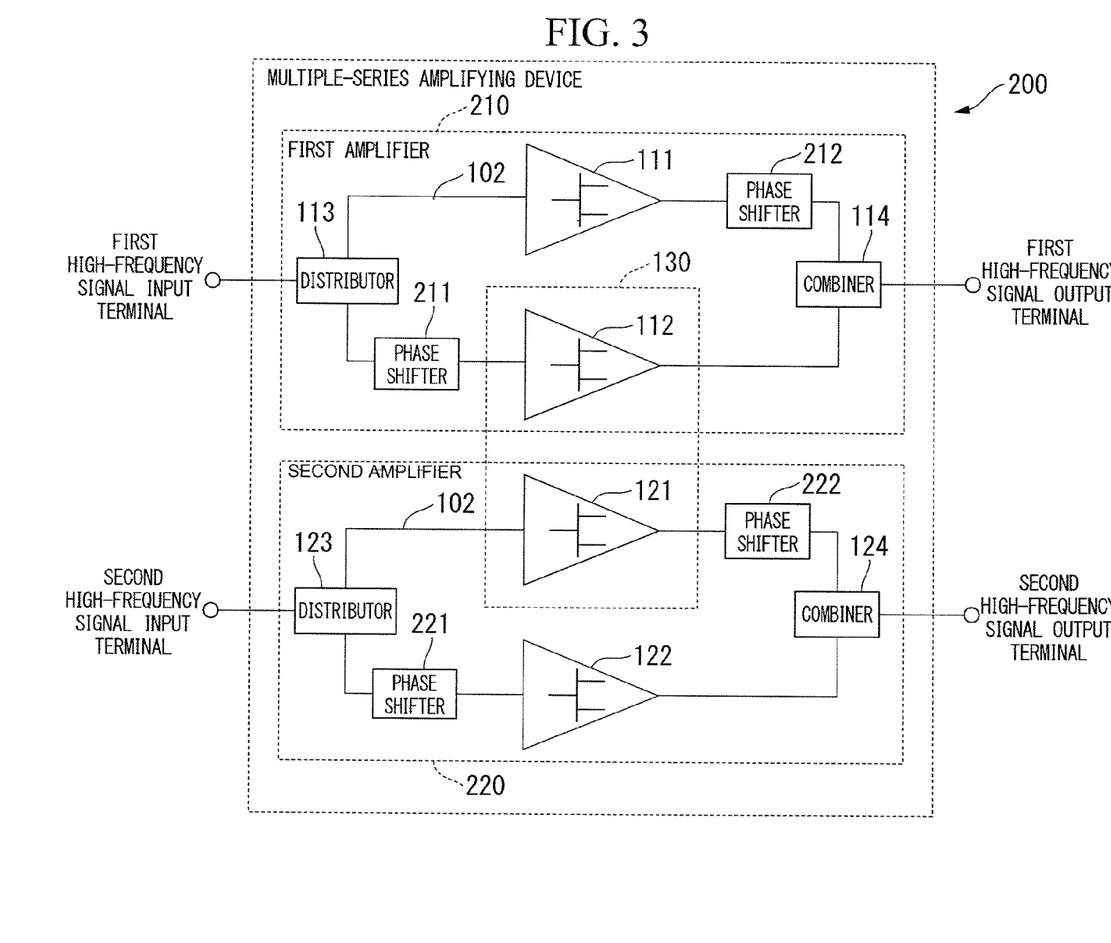
FIG. 3 is a circuit diagram showing the configuration of a multiple-series amplifying device according to a second embodiment of the present invention.

Next, a multiple-series amplifying device 200 serving as a multiple-series amplifying device according to the second embodiment of the present invention will be described with reference to FIG. 3. FIG. 3 is a circuit diagram diagrammatically showing the overall structure of the multiple-series amplifying device 200.

The parts of the multiple-series amplifying device 200 of the second embodiment identical to those of the multiple-series amplifying device 100 are denoted using the same names and the same reference signs; hence, detailed descriptions thereof will be omitted.

As shown in FIG. 3, the multiple-series amplifying device 200 of the present embodiment includes multiple series of amplifiers, i.e. a first amplifier 210 and a second amplifier 220. The first amplifier 210 includes the first semiconductor amplifying element 111 and the second semiconductor amplifying element 112, while the second amplifier 220 includes the first semiconductor amplifying element 121 and the second semiconductor amplifying element 122.

A pair of the second semiconductor amplifying element 112 and the first semiconductor amplifying element 121 adjoining together in the first amplifier 210 and the second amplifier 220 is formed in a single package 130.

In the first amplifier 210 of the multiple-series amplifying device 200 of the present embodiment, the first distributor 113 is connected to the second semiconductor amplifying element 112 via a first phase shifter 211.

In the first amplifier 210, the first semiconductor amplifying element 111 is connected to the combiner 114 via a second phase shifter 212.

Similarly, in the second amplifier 220, the second distributor 123 is connected to the second semiconductor amplifying element 122 via a first phase shifter 221.

In the second amplifier 220, the first semiconductor amplifying element 121 is connected to the second combiner 124 via a second phase shifter 222.

Thus, the multiple-series amplifying device 200 of the present embodiment is designed as a Doherty type in which the first semiconductor amplifying element 111 serves as a carrier amplifier; the second semiconductor amplifying element 112 serves as a peak amplifier; the first semiconductor amplifying element 121 serves as a peak amplifier; and the second semiconductor amplifying element 122 serves as a carrier amplifier.

In the multiple-series amplifying device 200 of the present embodiment having the aforementioned configuration, a first high-frequency signal and a second high-frequency signal are amplified with the first amplifier 210 and the second amplifier 220 in parallel.

Specifically, a first high-frequency signal input to the first amplifier 210 is distributed to two paths via the first distributor 113. The distributed high-frequency signal is directly input to the first semiconductor amplifying element 111.

In contrast, the distributed high-frequency signal is controlled in phase with the first phase shifter 211 and then input to the second semiconductor amplifying element 112. Thus, the distributed high-frequency signals are input to and amplified with the first semiconductor amplifying element 111 and the second semiconductor amplifying element 112.

The amplified high-frequency signal output from the first semiconductor amplifying element 111 is controlled in phase with the second phase shifter 212. Thus, two series of amplified high-frequency signals are combined together with the combiner 114, thus outputting a combined signal.

Similarly, a second high-frequency signal input to the second amplifier 220 is distributed to two paths via the second distributor 123. The distributed high-frequency signal is directly input to the first semiconductor amplifying element 121.

In contrast, the distributed high-frequency signal is controlled in phase with the first phase shifter 221 and then input to the second semiconductor amplifying element 122. Thus, the distributed high-frequency signals are input to and amplified with the first semiconductor amplifying element 121 and the second semiconductor amplifying element 122.

The amplified high-frequency signal output from the first semiconductor amplifying element 121 is controlled in phase with the second phase shifter 222. Two series of amplified high-frequency signals are combined together with the combiner 124, thus outputting a combined signal. Thus, the multiple-series amplifying device 200 of the present embodiment functions as a Doherty type to amplify two series of high-frequency signals in parallel.

Figure 4:
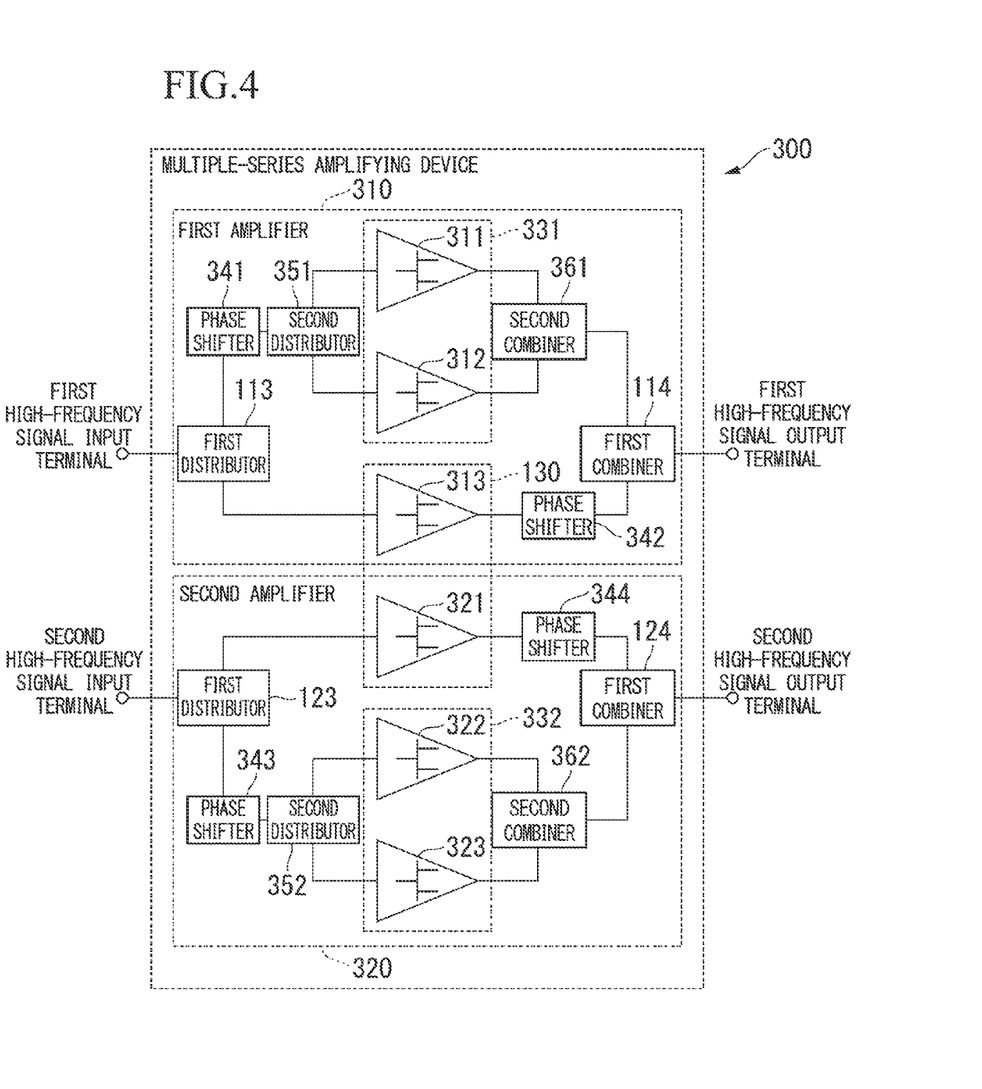
FIG. 4 is a circuit diagram showing the configuration of a multiple-series amplifying device according to a third embodiment of the present invention.

Next, a multiple-series amplifying device 300 serving as a multiple-series amplifying device according to the third embodiment of the present invention will be described with reference to FIG. 4. FIG. 4 is a circuit diagram diagrammatically showing the overall configuration of the multiple-series amplifying device 300.

The parts of the multiple-series amplifying device 300 of the third embodiment identical to those of the multiple-series amplifying device 200 of the second embodiment are denoted using the same names and the same reference signs; hence, detailed descriptions thereof will be omitted.

As shown in FIG. 4, the multiple-series amplifying device 300 of the present embodiment includes multiple series of amplifiers, i.e. a first amplifier 310 and a second amplifier 320. The first amplifier 310 includes a first semiconductor amplifying element 311, a second semiconductor amplifying element 312, and a third semiconductor amplifying element 313, while the second amplifier 320 includes a first semiconductor amplifying element 321, a second semiconductor amplifying element 322, and a third semiconductor amplifying element 323.

A pair of the third semiconductor amplifying element 313 and the first semiconductor amplifying element 321 adjoining together in the first amplifier 310 and the second amplifier 320 is formed in a single package 130.

Additionally, a pair of the first semiconductor amplifying element 311 and the second semiconductor amplifying element 312 adjoining together in the first amplifier 310 is formed in a single package 331.

Similarly, a pair of the second semiconductor amplifying element 322 and the third semiconductor amplifying element 323 adjoining together in the second amplifier 320 is formed in a single package 332.

In the first amplifier 310 of the multiple-series amplifying device 300 of the present embodiment, the first distributor 113 is connected to a pair of the first semiconductor amplifying element 311 and the second semiconductor amplifying element 312 via a first phase shifter 341 and a second distributor 351.

In the first amplifier 310, a pair of the first semiconductor amplifying element 311 and the second semiconductor amplifying element 312 is connected to the first combiner 114 via a second combiner 361, while the third semiconductor amplifying element 313 is connected to the first combiner 114 via a second phase shifter 342.

Similarly, in the second amplifier 320, the first distributor 123 is connected to a pair of the second semiconductor amplifying element 322 and the third semiconductor amplifying element 323 via a first phase shifter 343 and a second distributor 352.

In the second amplifier 320, a pair of the second semiconductor amplifying element 322 and the third semiconductor amplifying element 323 is connected to the first combiner 124 via a second combiner 362, while the first semiconductor amplifying element 321 is connected to the first combiner 124 via a second phase shifter 344.

The multiple-series amplifying device 300 of the present embodiment functions as a Doherty type with an asymmetrical ratio of two-to-one between peak amplifiers and carrier amplifiers in which a pair of the first semiconductor amplifying element 311 and the second semiconductor amplifying element 312 formed in a single package 331 collectively serves as a peak amplifier; the third semiconductor amplifying element 313 serves as a carrier amplifier; the first semiconductor amplifying element 321 serves as a carrier amplifier; and a pair of the second semiconductor amplifying element 322 and the third semiconductor amplifying element 323 formed in a single package 332 collectively serves as a peak amplifier.

The multiple-series amplifying device 300 having the aforementioned configuration is designed to amplify a first high-frequency signal and a second high-frequency signal with the first amplifier 310 and the second amplifier 320.

Specifically, in the first amplifier 310, a first high-frequency signal input to the first amplifier 310 is distributed to two paths via the first distributor 113. The distributed high-frequency signal is input to a pair of the first semiconductor amplifying element 311 and the second semiconductor amplifying element 312 in parallel via the first phase shifter 341 and the second distributor 351, while the other distributed high-frequency signal is directly input to the third semiconductor amplifying element 313.

The high-frequency signal is amplified with the first semiconductor amplifying element 311 and the second semiconductor amplifying element 312, and therefore the amplified high-frequency signal is input to the first combiner 114 via the second combiner 361.

On the other hand, the high-frequency signal amplified with the third semiconductor amplifying element 313 is input to the first combiner 114 via the second phase shifter 342. The first combiner 114 combines the high-frequency signals so as to output a combined signal.

Similarly, a second high-frequency signal input to the second amplifier 320 is distributed to two paths via the first distributor 123. The distributed high-frequency signal is directly input to the first semiconductor amplifying element 321.

The distributed high-frequency signal is input to a pair of the second semiconductor amplifying element 322 and the third semiconductor amplifying element 323 in parallel via the first phase shifter 343 and the second distributor 352, while the other high-frequency signal is directly input to the first semiconductor amplifying element 321.

The high-frequency signal input to a pair of the second semiconductor amplifying element 322 and the third semiconductor amplifying element 323 in parallel is amplified and then input to the first combiner 124 via the second combiner 362.

The high-frequency signal amplified with the first semiconductor amplifying element 321 is input to the first combiner 124 via the second phase shifter 344. The first combiner 124 combines the high-frequency signals so as to output a combined signal.

Thus, the multiple-series amplifying device 300 of the present embodiment functions as a Doherty type with an asymmetrical ratio of two-to-one between carrier amplifiers and peak amplifiers so as to amplify two series of high-frequency signals in parallel.

In the multiple-series amplifying device 300 of the present embodiment, a pair of the third semiconductor amplifying element 313 and the first semiconductor amplifying element 321 adjoining together in the first amplifier 310 and the second amplifier 320 is formed in a single package 130; a pair of the first semiconductor amplifying element 311 and the second semiconductor amplifying element 312 is formed in a single package 331 in the first amplifier 310; and a pair of the second semiconductor amplifying element 322 and the third semiconductor amplifying element 323 is formed in a single package 332 in the second amplifier 320.

In the multiple-series amplifying device 300 of the present embodiment, it is possible to reduce the number of parts for use in the semiconductor amplifying elements 311 to 323 so as to reduce the overall circuit scale, thus improving productivity.

The present invention is not necessarily limited to the foregoing embodiments; hence, the present invention allows for various modifications without departing from the subject matter thereof. For example, the multiple-series amplifying device 100 of the first embodiment is designed on the assumption that a power circuit applies power to the semiconductor amplifying elements 111 to 122 in parallel.

Figure 5:
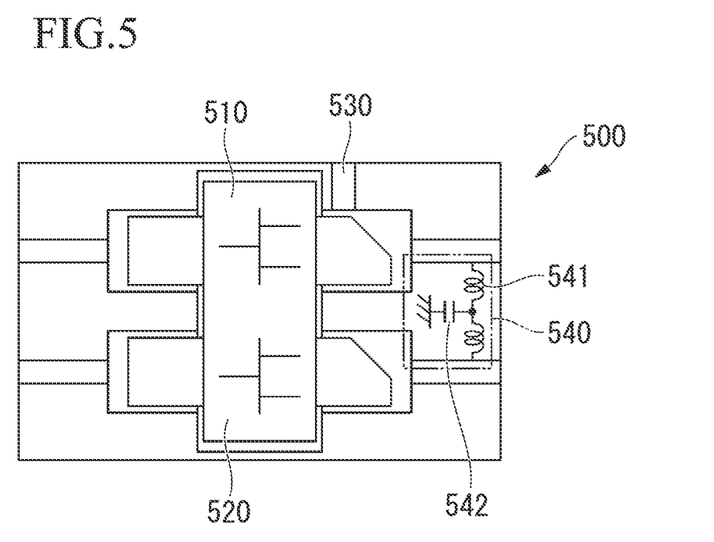
FIG. 5 is a circuit diagram showing the essential configuration of a multiple-series amplifying device according to a variation of the embodiment of the present invention.

FIG. 5 shows a first semiconductor amplifying element 510 and a second semiconductor amplifying element 520, which are formed in a single package 500. It is possible to additionally arrange a power supply line 530 used to supply DC power to one of the first semiconductor amplifying element 510 and the second semiconductor amplifying element 520, and a power supply circuit 540 used to supply DC power, supplied to the first semiconductor amplifying element 510, to the second semiconductor amplifying element 520.

For example, the power supply circuit 540 is made of a low-pass filter including coils 541 and a capacitor 542, which allows DC power to be transmitted therethrough but which blocks a high-frequency current.

The second embodiment of the present invention exemplifies a Doherty type of the multiple-series amplifying device 200 including a first amplifier which the first semiconductor amplifying element 111 serves as a carrier amplifier while the second semiconductor amplifying element 112 serves as a peak amplifier, and a second amplifier in which the first semiconductor amplifying element 121 serves as a peak amplifier while the second semiconductor amplifying element 122 serves as a carrier amplifier.

However, it is possible to design an inverted Doherty type of a multiple-series amplifying device (not shown) including a first amplifier in which the first semiconductor amplifying element 111 serves as a peak amplifier while the second semiconductor amplifying element 112 serves as a carrier amplifier, and a second amplifier in which the first semiconductor amplifying element 121 serves as a carrier amplifier while the second semiconductor amplifying element 122 serves as a peak amplifier.

Similarly, the third embodiment of the present invention exemplifies a Doherty type of the multiple-series amplifying device 300 including a first amplifier in which a pair of the first semiconductor amplifying element 311 and the second semiconductor amplifying element 312 serves as a peak amplifier while the third semiconductor amplifying element 313 serves as a carrier amplifier, and a second amplifier in which the first semiconductor amplifying element 321 serves as a carrier amplifier while a pair of the second semiconductor amplifying element 322 and the third semiconductor amplifying element 323 serves as a peak amplifier.

However, it is possible to design an inverted Doherty type of a multiple-series amplifying device (not shown) including a first amplifier in which a pair of the first semiconductor amplifying element 311 and the second semiconductor amplifying element 312 serves as a carrier amplifier while the third semiconductor amplifying element 313 serves as a peak amplifier, and a second amplifier in which the first semiconductor amplifying element 321 serves as a peak amplifier while a pair of the second semiconductor amplifying element 322 and the third semiconductor amplifying element 323 serves as a carrier amplifier.

Moreover, the amplifiers 110 and 120 exemplify two series of configurations in the multiple-series amplifying devices 100, 200, and 300. However, it is possible to form three or more series of configurations (not shown).

REFERENCE SIGNS LIST

100 Multiple-series amplifying device serving as multiple series of amplifying devices
110 amplifier
120 amplifier
111 semiconductor amplifying element
112 semiconductor amplifying element
121 semiconductor amplifying element
122 semiconductor amplifying element
113 distributor
114 combiner
123 distributor
124 combiner
130 package
131 metal wall
101 printed circuit board
102 signal transmitting line
103 via-hole
200 multiple-series amplifying device serving as multiple series of amplifying devices
210 amplifier
220 amplifier
211 phase shifter
212 phase shifter
221 phase shifter
222 phase shifter
300 multiple-series amplifying device serving as multiple series of amplifying devices
310 amplifier
320 amplifier
311 semiconductor amplifying element
312 semiconductor amplifying element
313 semiconductor amplifying element
321 semiconductor amplifying element
322 semiconductor amplifying element
323 semiconductor amplifying element
331 package
332 package
341 phase shifter
351 distributor
361 combiner
342 phase shifter
343 phase shifter
352 distributor
362 combiner
344 phase shifter
500 package
510 semiconductor amplifying element
520 semiconductor amplifying element
530 power supply line
540 power supply circuit
541 coil
542 capacitor

The invention claimed is:

1. A multiple-series amplifying device comprising:
a first amplifier including a first pair of semiconductor amplifying elements coupled together, wherein the first amplifier is configured to amplify a first high-frequency signal; and
a second amplifier including a second pair of semiconductor amplifying elements coupled together, wherein the second amplifier is configured to amplify a second high-frequency signal,
wherein the first amplifier and the second amplifier are disposed in parallel such that a first semiconductor amplifying element, included in the first pair of semiconductor amplifying elements, is positioned adjacent to a second semiconductor amplifying element included in the second pair of semiconductor amplifying elements, and
wherein the first semiconductor amplifying element and the second semiconductor amplifying element are partitioned using an electric isolation and formed in a single package.

2. The multiple-series amplifying device according to claim 1, wherein the electric isolation is made of a metal wall.

3. The multiple-series amplifying device according to claim 2, further comprising:
a printed circuit board used to form the first and second amplifiers thereon;
a signal transmitting line, made of a microstrip line formed on the printed circuit board, which is configured to transmit first or second high-frequency signal to the first or second amplifier;
a ground pattern applied to the signal transmitting line formed on the printed circuit board; and
a metal pattern which is formed on the printed circuit board so as to connect the metal wall to the ground pattern.

4. The multiple-series amplifying device according to claim 3, wherein the first and second amplifiers, the signal transmitting line, and the metal pattern are formed on a surface of the printed circuit boards, wherein the ground pattern is formed on a back of the printed circuit board, and wherein the metal pattern is connected to the ground pattern through via-holes formed in the printed circuit board.

5. The multiple-series amplifying device according to claim 1, wherein each of the first and second amplifiers includes a distributor used to distribute the first or second high-frequency signal, the first or second pair of semiconductor amplifying elements, and a combiner used to combine the amplified signals.

6. The multiple-series amplifying device according to claim 1, wherein the first or second amplifier serves as a Doherty amplifier including a pair of a carrier amplifier and a peak amplifier with the first or second pair of semiconductor amplifying elements, and wherein the first and second semiconductor amplifying elements coupled together correspond to a pair of carrier amplifiers coupled together or a pair of peak amplifiers coupled together.

7. The multiple-series amplifying device according to claim 6, wherein each of the first and second amplifiers serves as an asymmetrical Doherty amplifier with a disproportional ratio between the carrier amplifier and the peak amplifier in terms of a number of semiconductor amplifying elements.

8. The multiple-series amplifying device according to claim 1, further comprising:
- a power supply line configured to supply DC power to the first and second semiconductor amplifying elements formed in the single package; and
- a power supply circuit configured to supply the DC power to the first and second pair of semiconductor amplifying elements other than the first and second semiconductor amplifying elements,
- wherein the power supply circuit allows the DC power to be transmitted therethrough but blocks a first or second high-frequency current.

9. The multiple-series amplifying device according to claim 8, wherein the power supply circuit is made of a low-pass filter including a capacitor and coils.

* * * * *